US011646287B2

(12) United States Patent
Takaku

(10) Patent No.: US 11,646,287 B2
(45) Date of Patent: May 9, 2023

(54) SEMICONDUCTOR DEVICE

(71) Applicant: Kioxia Corporation, Tokyo (JP)

(72) Inventor: Satoru Takaku, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/188,595

(22) Filed: Mar. 1, 2021

(65) Prior Publication Data

US 2022/0028815 A1 Jan. 27, 2022

(30) Foreign Application Priority Data

Jul. 22, 2020 (JP) .............................. JP2020-125554

(51) Int. Cl.
*H01L 23/00* (2006.01)
*H01L 23/31* (2006.01)
*H01L 23/498* (2006.01)

(52) U.S. Cl.
CPC .......... *H01L 24/16* (2013.01); *H01L 23/3157* (2013.01); *H01L 23/49838* (2013.01); *H01L 24/73* (2013.01); *H01L 24/81* (2013.01); *H01L 2224/16157* (2013.01); *H01L 2224/73204* (2013.01); *H01L 2224/81203* (2013.01); *H01L 2924/3511* (2013.01)

(58) Field of Classification Search
CPC ............................ H01L 24/16; H01L 23/3157; H01L 23/49838
See application file for complete search history.

(56) References Cited

U.S. PATENT DOCUMENTS

| 6,221,690 | B1 | 4/2001 | Taniguchi | |
|---|---|---|---|---|
| 9,185,806 | B2 | 11/2015 | Takagi | |
| 2006/0051895 | A1* | 3/2006 | Abe | ...................... H01L 23/642 |
| | | | | 257/E21.705 |
| 2006/0289972 | A1* | 12/2006 | Nishimura | .............. H01L 24/17 |
| | | | | 257/E21.511 |
| 2008/0277802 | A1 | 11/2008 | Tsai et al. | |
| 2010/0252304 | A1* | 10/2010 | Muramatsu | ........... H01L 21/563 |
| | | | | 174/251 |
| 2011/0108982 | A1* | 5/2011 | Kim | ...................... H01L 23/488 |
| | | | | 174/262 |

(Continued)

FOREIGN PATENT DOCUMENTS

| JP | H08-213741 | A | 8/1996 |
|---|---|---|---|
| JP | H11-186432 | A | 7/1999 |
| JP | 2014-072372 | A | 4/2014 |

(Continued)

*Primary Examiner* — Errol V Fernandes
(74) *Attorney, Agent, or Firm* — Foley & Lardner LLP

(57) ABSTRACT

A semiconductor device includes an insulating substrate, a wiring, a semiconductor chip and a resin layer. The wiring is provided on the insulating substrate. The wiring board includes (i) an insulating material and (ii) a pad exposed relative to the insulating material and electrically connected to the wiring. A height of the insulating material in a vertical direction of the wiring board varies along the wiring board. The semiconductor chip includes a bump connected to the pad on a first surface of the semiconductor chip. The resin layer covers a periphery of the bump between the wiring board and the semiconductor chip.

19 Claims, 10 Drawing Sheets

(56) References Cited

U.S. PATENT DOCUMENTS

2016/0172287 A1    6/2016  Arisaka et al.
2019/0021167 A1*   1/2019  Yamamoto .............. H01L 24/81

FOREIGN PATENT DOCUMENTS

| JP | 2015-226050 A | 12/2015 |
| JP | 3209290 U | 3/2017 |
| JP | 2019-220606 A | 12/2019 |
| TW | 200845346 A | 11/2008 |

\* cited by examiner

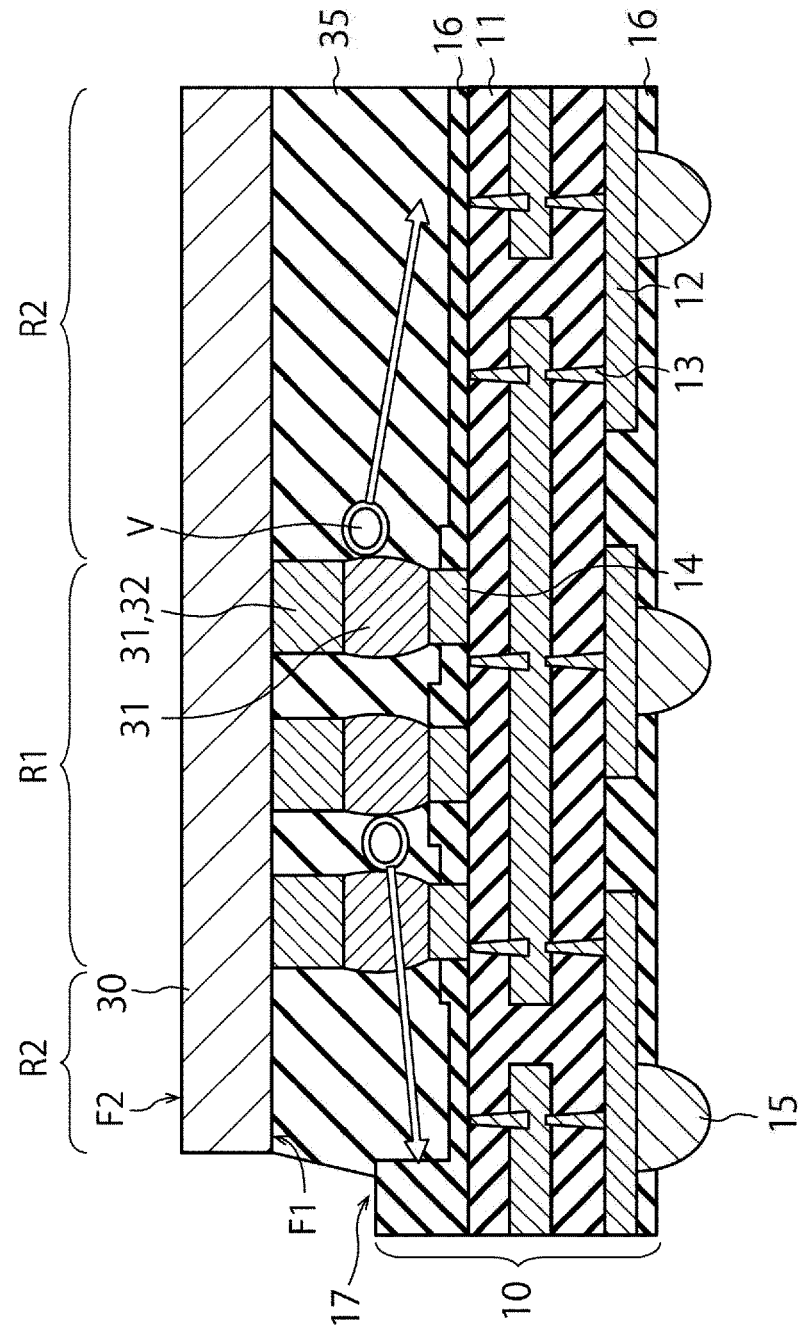

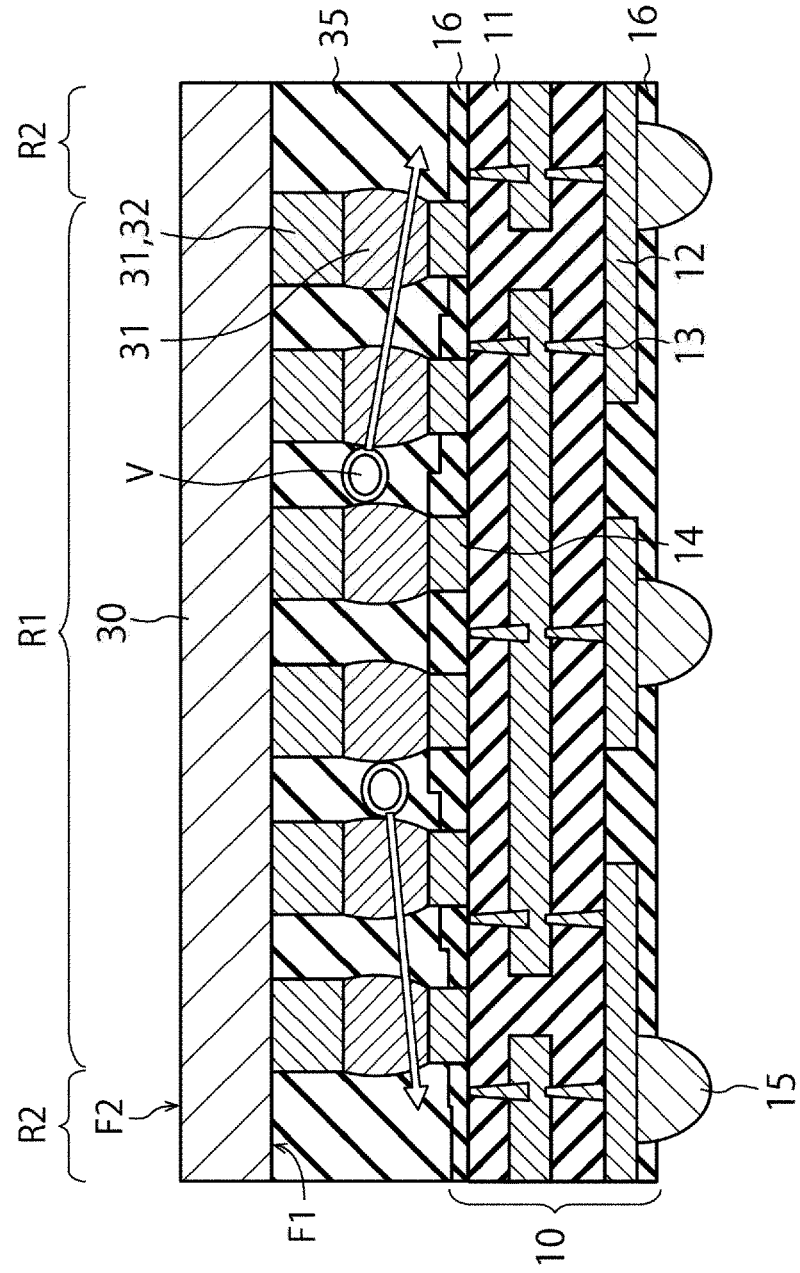

SEMICONDUCTOR DEVICE

CROSS-REFERENCE TO RELATED APPLICATION

This application is based upon and claims the benefit of priority from Japanese Patent Application No. 2020-125554, filed on Jul. 22, 2020, the entire contents of which are incorporated herein by reference.

FIELD

Embodiments described herein relate generally to a semiconductor device.

BACKGROUND

As a method of performing flip-chip connection of a semiconductor chip to a wiring board, there are a mass reflow method, a thermocompression bonding method, and the like. Among these methods, in the flip-chip connection by the thermocompression bonding method, when the semiconductor chip is mounted on the wiring board, a solder is melted by heat, and a bump of the semiconductor chip and a pad of the wiring board are thermocompression bonded to be connected.

However, there is a possibility that, during flip-chip connection, the semiconductor chip is warped due to heating and defective connection between the semiconductor chip and the wiring board occurs. In the thermocompression bonding method, a void may be trapped in a resin (adhesive) that protects a connection portion with a substrate. Moisture in this void becomes an electrical leak path, and accordingly, there is a possibility that a defective operation of the semiconductor chip occurs.

DESCRIPTION OF THE DRAWINGS

FIG. 7A is a cross-sectional view illustrating a configuration example of the wiring board, the resin layer, and surroundings thereof in A-A' line of FIG. 6.

FIG. 7B is a cross-sectional view illustrating a configuration example of the wiring board, the resin layer, and surroundings thereof in B-B' line of FIG. 6.

DETAILED DESCRIPTION

Figure 1:
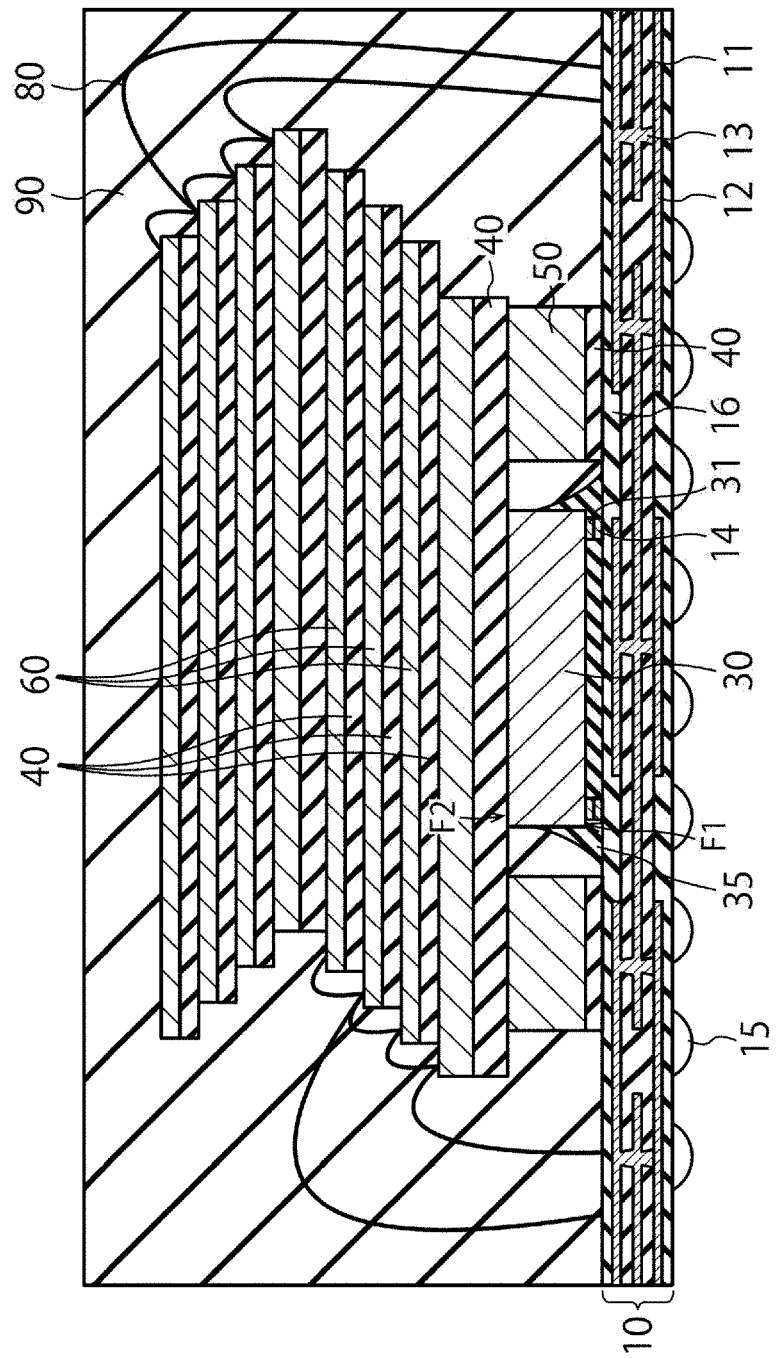
FIG. 1 is a cross-sectional view illustrating a configuration example of a semiconductor device according to a first embodiment.

Embodiments provide a semiconductor device capable of preventing occurrence of defects in flip-chip connection.

In general, according to one embodiment, there is provided a semiconductor device including a wiring board, a semiconductor chip, and a resin layer. The wiring board includes an insulating material and a pad that is exposed from the insulating material and is electrically connected to a wiring provided on an insulating substrate. A height of the insulating material varies according to a location on the wiring board. The semiconductor chip includes a bump connected to the pad on a first surface facing the wiring board. The resin layer covers a periphery of the bump between the wiring board and the semiconductor chip.

Hereinafter, embodiments according to the present disclosure will be described with reference to the drawings. These embodiments do not limit the present disclosure. In the following embodiments, a vertical direction of a wiring board indicates a direction perpendicular to a surface on which a semiconductor chip is mounted is facing up, and may be different from the vertical direction according to gravitational acceleration. The drawings are schematic or conceptual, and a ratio of each part is not always the same as the actual one. In the specification and the drawings, the same elements as those described above with respect to the existing drawings are designated by the same reference numerals, and detailed description thereof will be omitted as appropriate.

First Embodiment

FIG. 1 is a cross-sectional view illustrating a configuration example of a semiconductor device 1 according to a first embodiment. The semiconductor device 1 according to this embodiment is, for example, a NAND flash memory. The semiconductor device 1 includes a wiring board 10, a controller chip 30 as a semiconductor chip, a resin layer 35, a resin layer 90, a resin layer 40, a spacer 50, and a NAND memory chip as a semiconductor chip (hereinafter, a memory chip) 60, and a bonding wire 80. The resin layer 90 is a so-called mold resin, which is a sealing resin. This embodiment is not limited to the NAND flash memory, and is applicable to semiconductor devices subjected to flip-chip connection.

The wiring board 10 includes an insulating substrate 11, a wiring 12, a contact plug 13, a metal pad 14, a solder ball 15, and a solder resist 16. The insulating substrate 11 is, for example, a prepreg, which is a composite material of a fibrous reinforcing material such as glass fiber and a thermosetting resin such as epoxy. For the insulating substrate 11, for example, an insulating material such as a glass epoxy resin or a ceramic (alumina-based ceramic, AlN-based ceramic) may be used. The wiring 12 is provided on a front surface, a rear surface, or an inside of the insulating substrate 11, and electrically connects the metal pad 14 and the solder ball 15. The metal pad 14 may be a part of the wiring 12. The contact plug 13 penetrates the inside of the insulating substrate 11 and electrically connects the wirings 12. The metal pad 14 is connected to a metal bump 31 of the controller chip 30 on the front surface of the wiring board 10. The solder ball 15 is connected to the wiring 12 on the rear surface of the wiring board 10. For the wiring 12, the contact plug 13, and the metal pad 14, for example, a single film, a composite film, or an alloy film of a conductive material such as Cu, Ni, Au, Sn, Ag, Bi, or Pd is used. For the solder ball 15, for example, a conductive material such as a single film such as Sn, Ag, Cu, Au, Bi, Zn, In, Sb, or Ni, a composite film thereof, or an alloy film thereof is used. The solder resist 16 is provided on the front surface and the rear surface of the wiring board 10 and is provided between the adjacent metal pads 14 and around the metal pads 14, or between the adjacent solder balls 15 to electrically insulate these components. The solder resist 16 may cover the front surface of the wiring 12 to protect the wiring 12.

More specifically, the wiring board 10 includes the solder resist 16 and the metal pad 14 that is exposed from the solder resist 16 and is electrically connected to the wiring 12 provided on the insulating substrate 11.

The controller chip 30 has a surface F1 facing the wiring board 10 and a surface F2 on a side opposite to the surface F1. A plurality of metal bumps 31 are provided on the surface F1. The metal bump 31 is connected (welded) to the metal pad 14 of the wiring board 10. That is, the controller chip 30 is flip-chip connected onto the wiring board 10. For the metal bump 31, for example, a conductive metal such as solder is used. The substrate of the semiconductor chip may be a silicon substrate, a GaAg substrate, a SiC substrate, or the like.

The controller chip 30 is thinned and includes a semiconductor element on the surface F1 or surface F2. The controller chip 30 may warp during the formation of the semiconductor element. The warpage of the controller chip 30 may be, for example, mountain-shaped, bowl-shaped or saddle-shaped. In FIG. 1, the warpage of the controller chip 30 is not illustrated.

The resin layer 35 is buried between the wiring board 10 and the surface F1 of the controller chip 30. The resin layer 35 is, for example, an underfill, and a non-conductive resin material of liquid type is used for the resin layer 35. The resin layer 35 covers the periphery of the metal pad 14 and the metal bump 31. With this configuration, the resin layer 35 supports the connection between the metal pad 14 and the metal bump 31 and prevents breakage between the metal pad 14 and the metal bump 31.

For the resin layer 35, for example, an epoxy resin, a silicone resin, an epoxy/silicone mixed resin, an acrylic resin, a polyimide resin, a polyamide resin, a phenol resin, or the like may be used as a base material.

The resin layer 35 contains a reducing material such as alcohols or an organic acid as an additive amount in order to remove a metal oxide film formed on the front surface of the metal bump 31. Examples of alcohols include at least one selected from methanol, ethanol, isopropyl alcohol, polyvinyl alcohol, ethylene glycol, propylene glycol, diethylene glycol, glycerin, triethylene glycol, tetraethylene glycol, carbitol, cellosolve alcohol, and the like. An alkyl ether-based material may be used. Examples of the alkyl ether-based material include diethylene glycol monobutyl ether, triethylene glycol dimethyl ether, and the like. Alkane, amine compounds, and the like may also be used. Examples of the alkane amine compound include formamide, dimethylformamide, and the like. These materials may be used alone or in combination of a plurality of the materials. An organic acid may be added to these materials. Examples of the organic acid include formic acid, acetic acid, benzoic acid, abietic acid, palastolic acid, dehydroabietic acid, isopimaric acid, neoavietic acid, pimaric acid, rosin, and the like. These material may be used alone or in combination of a plurality of the materials. The resin layer 35 is applied by a method such as a dispensing method (jet method, screw method) or a printing method. The resin layer 35 has a function of reducing and removing oxide films (SnO, $SnO_2$) or the like on the front surface of the metal bump 31 and the metal pad 14.

The spacer 50 is provided on the wiring board 10 around the controller chip 30 via the resin layer 40. For the resin layer 40, for example, a die attach film (DAF) is used. The spacer 50 is adhered onto the wiring board 10 by the resin layer 40. The spacer 50 has a height substantially equal to the height of the surface F2 of the controller chip 30 and supports the memory chip 60. In the present disclosure, a height or thickness of an element of a wiring board is defined in a vertical direction of the wiring board. The spacer 50 has, for example, a quadrangular frame shape or a quadrangular shape that surrounds the controller chip 30, and surrounds four sides of the controller chip 30 on the front surface of the wiring board 10 (not illustrated). For the spacer 50, for example, a material such as silicon, glass, ceramic, an insulating substrate, or a metal plate is used. In order to improve adhesion, an organic film such as a polyimide resin, a polyamide resin, an epoxy resin, an acrylic resin, a phenol resin, a silicone resin, or a polybenzoxazole (PBO) resin may be formed on the spacer 50.

The memory chip 60 is provided above the controller chip 30, and is fixed onto the controller chip 30 and the spacer 50 by the resin layer 40. The memory chip 60 includes, for example, a three-dimensional memory cell array in which a plurality of memory cells are three-dimensionally arranged. The resin layer 40 is provided on the surface F2 of the controller chip 30 and the spacer 50, and fixes the memory chip 60 onto the controller chip 30 and the spacer 50.

A plurality of resin layers 40 and a plurality of memory chips 60 may be alternately stacked on the controller chip 30 and the spacer 50. In this way, even if the plurality of memory chips 60 are stacked on the controller chip 30, the warpage of the controller chip 30 is reduced, and thus the plurality of memory chips 60 are hardly affected by the warpage of the controller chip 30. That is, the plurality of memory chips 60 are hardly chipped, and are hardly peeled off from the resin layer 40.

The bonding wire 80 electrically connects between the metal pad 70 of the memory chip 60 and any of the metal pads 14 of the wiring board 10. The resin layer 90 covers and protects the entire structure above the wiring board 10, such as the controller chip 30, the memory chip 60, and the bonding wire 80. The resin layer 90 is filled between the wiring board 10 and the surface F1 of the controller chip 30 and covers the periphery of the metal bump 31.

In FIG. 1, both the controller chip 30 subjected to flip-chip connection and the connected memory chip 60 subjected to wire bonding are provided in the same semiconductor package. That is, in FIG. 1, a hybrid type multi-chip package is illustrated. However, in this embodiment, the plurality of memory chips 60 may be subjected to flip-chip connection similar to the controller chip 30. In this case, the controller chip 30 and the plurality of memory chips 60 may be electrically connected through a through silicon via (TSV).

The spacer 50 illustrated in FIG. 1 may not be provided. In this case, for example, the controller chip 30 is buried with a thick resin layer 40 from above, and the memory chip 60 is provided above the resin layer 40. When another chip is not mounted above the controller chip 30, the resin layer 90 may exist on the controller chip 30.

Next, the wiring board 10 and the resin layer 35 will be described.

Figure 2:
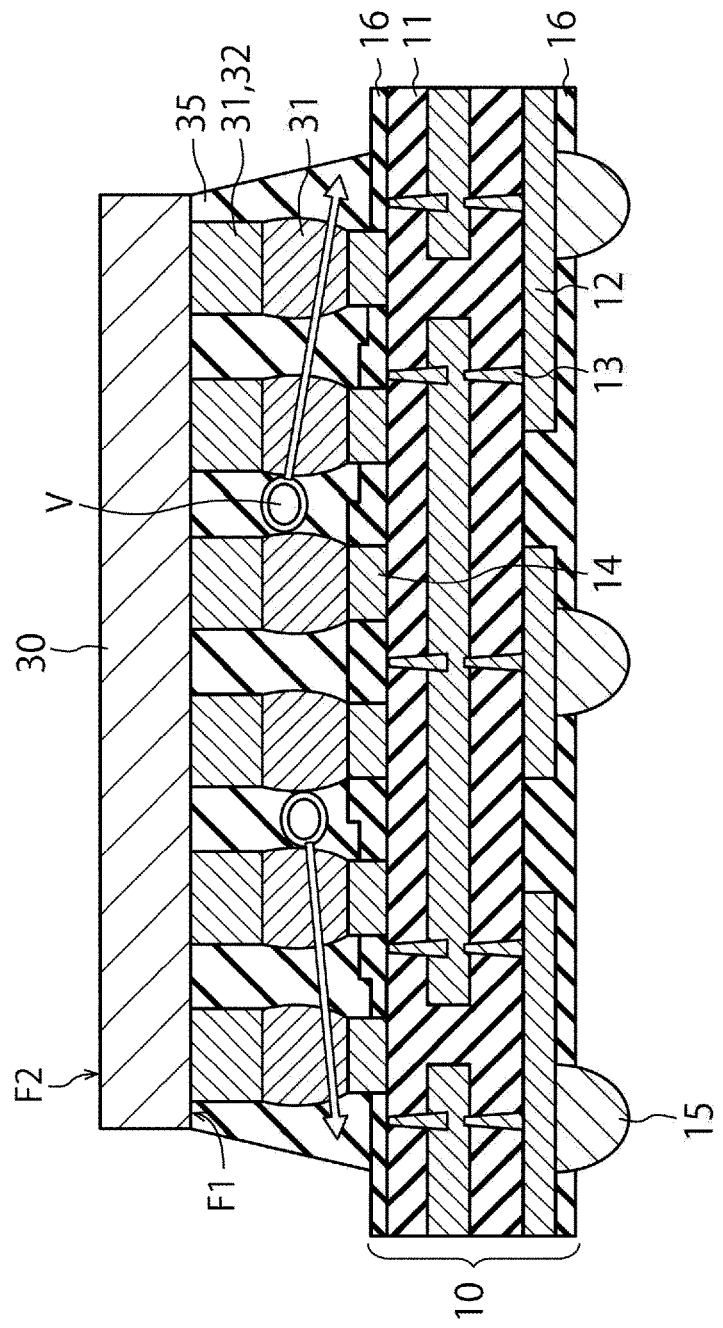
FIG. 2 is a cross-sectional view illustrating a configuration example of a wiring board, a resin layer, and surroundings thereof according to the first embodiment.

FIG. 2 is a cross-sectional view illustrating a configuration example of the wiring board 10, the resin layer 35, and surroundings thereof according to the first embodiment. As illustrated in FIG. 2, an electrode pillar 32 may be provided on the surface F1 of the controller chip 30. The electrode pillar 32 is connected to the metal bump 31. For the electrode pillar 32, for example, a conductive metal such as copper is used. Heights of the plurality of electrode pillars 32 are, for example, substantially constant. Heights of the plurality of metal pads 14 are, for example, substantially constant. In the example illustrated in FIG. 2, lower surfaces of the metal pad 14 and the solder resist 16 correspond to an upper surface of the insulating substrate 11.

In the example illustrated in FIG. 2, the resin layer 35 is, for example, non-conductive film (NCF) or non-conductive paste (NCP). The controller chip 30 is adhered to the wiring board 10 by thermocompression bonding, for example. The NCF is attached, for example, onto the surface F1 of the controller chip 30 or onto the wiring board 10 before thermocompression bonding. The NCP is applied, for example, onto the wiring board 10 before thermocompression bonding. In the following, as an example, a case where the NCF as the resin layer 35 is attached to the surface F1 will be described. The flip-chip connection is not limited to thermocompression bonding, as long as the resin layer 35 is filled during flip-chip connection, and the flip-chip connection may be performed by ultrasonic waves.

Here, in the thermocompression bonding method, the controller chip 30 is mounted on the wiring board 10, and the controller chip 30 is pressed while being heated. In this case, the resin layer 35 is only pressed and is hard to flow. Accordingly, a void (gap) V contained between the wiring board 10 and the resin layer 35 or in the resin layer 35 is hardly discharged and is easily trapped in the resin layer 35. If moisture enters the void V, a leak path is generated by electrical connection between the voids V. There is a possibility that this leak path leads to the defective operation of the controller chip 30.

Therefore, as illustrated in FIG. 2, the solder resist 16 has a different height (thickness) according to the location on the wiring board 10. The solder resist 16 contains an insulating material. With this configuration, the pressed resin layer 35 becomes easy to flow on the wiring board 10. That is, the difference in the thickness of the solder resist 16 causes a pressure difference in the resin layer 35, and the pressed resin layer 35 can be made easy to flow.

More specifically, the solder resist 16 gradually becomes lower (thinner) from a central portion to an outer peripheral portion of the controller chip 30 facing the solder resist 16. In thermocompression bonding, first, the central portion of the controller chip 30 comes into contact with the central portion of the resin layer 35. This is because the solder resist 16 below the central portion of the controller chip 30 is the thickest. Furthermore, when the resin layer 35 is pressed, pressure is also applied to the outer peripheral portion of the resin layer 35. In this case, since the solder resist 16 is the thickest, the pressure of the resin layer 35 at the central portion becomes the highest. On the other hand, as the solder resist 16 becomes thinner from the central portion to the outer peripheral portion of the controller chip 30, the pressure of the resin layer 35 also decreases. Accordingly, the resin layer 35 becomes easy to flow toward the outer peripheral portion of the controller chip 30 where the pressure is low. With this configuration, as illustrated in FIG. 2, the void V in the resin layer 35 also becomes easy to move to the outer peripheral portion of the controller chip 30 as illustrated by the arrow. As a result, the void V is made easy to be discharged from the inside of the resin layer 35.

More specifically, the maximum value of height of the solder resist 16 facing the controller chip 30 is equal to or less than the height of the metal pad 14. The thickness of the metal pad 14 is, for example, approximately 10 μm. The thickness of the solder resist 16 below the central portion of the controller chip 30 is, for example, less than or equal to the thickness of the metal pad 14 and is approximately 8 μm to approximately 10 μm. The thickness of the solder resist 16 decreases stepwise, for example, at every 2 μm toward the outer peripheral portion of the controller chip 30.

More specifically, the height of the solder resist 16 around the metal pad 14 is substantially constant. With this configuration, the metal bumps 31 becomes easy to come into contact with the metal pads 14 more evenly around the metal pads 14. As a result, connection reliability of the metal bump 31 can be improved. In the example illustrated in FIG. 2, the thickness of the solder resist 16 changes stepwise in predetermined locations between the metal pads 14.

The steps of the solder resist 16 are substantially concentric when viewed from above the surface F2 of the controller chip 30, for example. In this case, the resin layer 35 has little bias and flows smoothly. However, the step shape when viewed from above the surface F2 is not limited to a substantially circular shape, and may be, for example, a substantially quadrangular shape. In this case, the solder resist 16 is made easy to correspond to the arrangement of the metal pad 14 and the design is made easier.

More specifically, the height of the solder resist 16 facing the controller chip 30 varies on at least one metal pad 14 basis. In the example illustrated in FIG. 2, the solder resist 16 is thinned on a single metal pad 14 basis. However, the embodiment is not limited thereto, and the solder resist 16 may be thinned on a plurality of the metal pads 14 basis.

The solder resists 16 having different thicknesses are formed, for example, by thinning processing. For example, the solder resist 16 applied on the wiring board 10 (insulating substrate 11) is exposed, the wiring board 10 is immersed in a chemical solution, the solder resist 16 into which the chemical solution is infiltrated is removed, and the wiring board 10 is cleaned. By repeating this process, a stepped solder resist 16 can be formed. After that, curing processing of the solder resist 16 is performed. When increasing the number of steps of the solder resist 16, the solder resist 16 to be applied in advance may be thickened and thinning processing may be repeated. For example, a film-shaped solder resist 16 having a thickness of approximately 20 μm to approximately 30 μm may fill the metal pad 14 before the thinning processing.

As described above, the height of the solder resist 16 differs according to the location on the wiring board 10. With this configuration, the resin layer 35 becomes easy to flow during mounting of the controller chip 30. The solder resist 16 gradually becomes lower from the central portion to the outer peripheral portion of the facing controller chips 30. With this configuration, the void V is made easy to be discharged from the resin layer 35. As a result, for example, the defective operation of the controller chip 30 caused by the void V can be prevented.

As another method for discharging the void, for example, a method of deforming the central portion of the semiconductor chip so as to project downward in a convex spherical shape and mounting the semiconductor chip on a substrate is known. However, in this case, there is a possibility that connection with the substrate by flip-chip connection becomes difficult due to the deformation of the semiconductor chip.

In contrast, in the first embodiment, the flow of the resin layer 35 can be promoted by changing the thickness of the solder resist 16, and the void V can be discharged without affecting the flip-chip connection.

The controller chip 30 may be another semiconductor chip to be subjected to flip-chip connection. The controller chip 30 may be a dynamic random access memory (DRAM), a magnetoresistive random access memory (MRAM), a NAND flash memory, or the like.

The solder resist 16 does not have an opening 161 (see FIG. 3) that exposes the insulating substrate 11 from the solder resist 16. The opening 161 is usually a hole formed when the metal pad 14 is exposed from the solder resist 16. The insulating substrate 11 absorbs moisture in the atmosphere. When the insulating substrate 11 is exposed from the solder resist 16, moisture in the insulating substrate 11 becomes easy to enter the resin layer 35 or the void V in the resin layer 35. In contrast, in the first embodiment, the insulating substrate 11 is covered with at least the thin solder resist 16 and is not exposed from the solder resist 16. With this configuration, entry of moisture into the resin layer 35 can be prevented. As a result, high accelerated stress test (HAST) resistance can be improved. The HAST is one of the insulation evaluation tests and is used for evaluation of humidity resistance.

Modification Example 1

Figure 3:
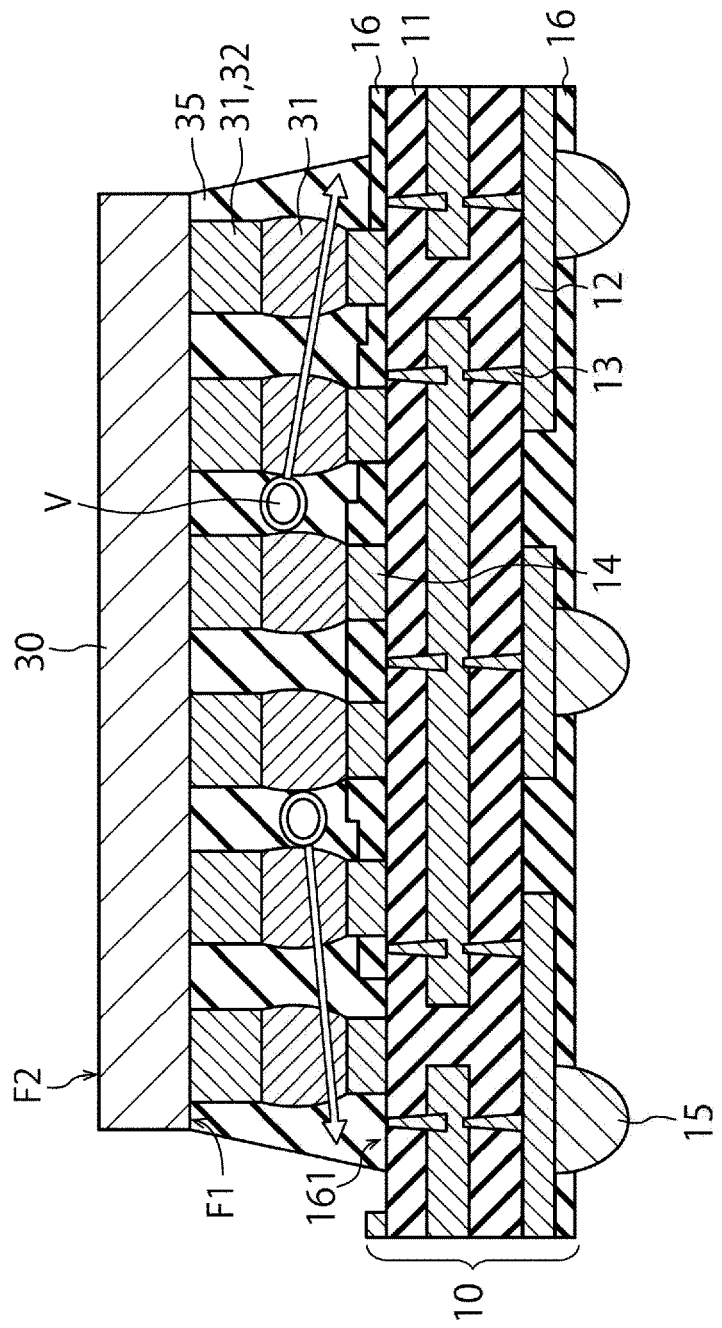
FIG. 3 is a cross-sectional view illustrating a configuration example of a wiring board, a resin layer, and surroundings thereof according to Modification example 1.

FIG. 3 is a cross-sectional view illustrating a configuration example of the wiring board 10, the resin layer 35, and surroundings thereof according to Modification example 1. Modification example 1 of the first embodiment is different from the first embodiment in that the opening (hole) 161 is provided.

That is, the solder resist 16 has the opening 161 that exposes the insulating substrate 11. With this configuration, the difference between the minimum value and the maximum value of the thickness of the solder resist 16 becomes large. As a result, the resin layer 35 can be made easy to flow, and the void V can be made easy to be discharged.

Since other configurations of the semiconductor device 1 according to Modification example 1 are the same as the corresponding configurations of the semiconductor device 1 according to the first embodiment, detailed description thereof will be omitted. The semiconductor device 1 according to Modification example 1 can obtain the same effect as that of the first embodiment.

Modification Example 2

Figure 4:
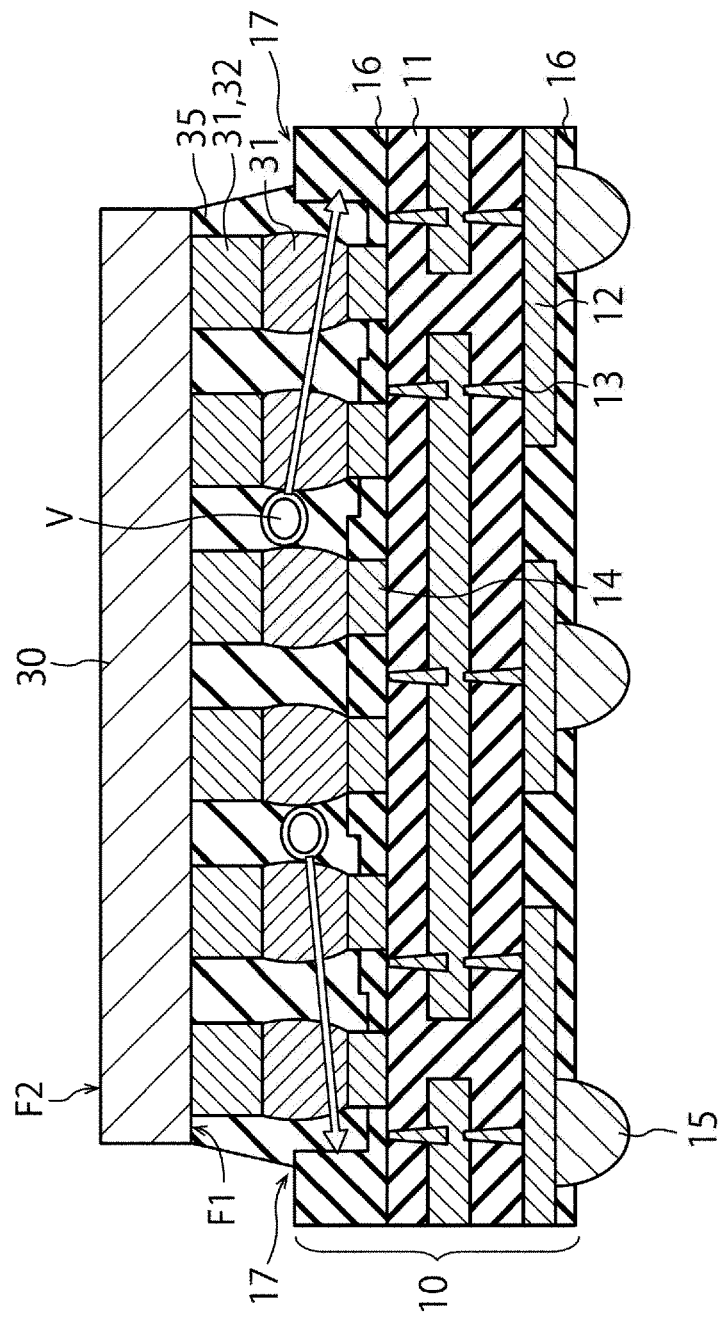
FIG. 4 is a cross-sectional view illustrating a configuration example of a wiring board, a resin layer, and surroundings thereof according to Modification example 2.

FIG. 4 is a cross-sectional view illustrating a configuration example of the wiring board 10, the resin layer 35, and surroundings thereof according to Modification example 2. Modification example 2 of the first embodiment is different from the first embodiment in that the solder resist 16 is thickly provided on the outer peripheral portion of the controller chip 30 so as to function as a dam.

The wiring board 10 further includes a projecting portion 17 that projects from the solder resist 16 toward the outer peripheral portion of the controller chip 30 and the height of an upper surface of the wiring board 10 is equal to or greater than the height of the metal pad 14. For the projecting portion 17, for example, the same material as the solder resist 16 is used. In this case, the projecting portion is formed integrally with the solder resist 16. The projecting portion 17 is provided, for example, along the outer peripheral portion of the controller chip 30. The projecting portion 17 functions as a dam for damming the flowing resin layer 35 on the outer peripheral portion of the controller chip 30. With this configuration, an excessive spread of the resin layer 35 due to excessive flow can be prevented. The pressure of the resin layer 35 can be increased, and the void V moved to the outer peripheral portion of the controller chip 30 can be crushed. Furthermore, adverse effects caused by seeping out (bleeding) from the resin layer 35 of the low molecular weight compound can be prevented. The projecting portion 17 illustrated in FIG. 4 is provided on the outside of the controller chip 30 when viewed from above the surface F2 of the controller chip 30. However, the embodiment is not limited thereto, and a part of the projecting portion 17 may be inside the controller chip 30.

The thickness of the projecting portion 17 (and the solder resist 16) may be substantially the same as the thickness of the thickest solder resist 16 below the controller chip 30, such as the central portion of the controller chip 30. With this configuration, the number of processes of thinning processing can be further reduced.

Since other configurations of the semiconductor device 1 according to Modification example 2 are the same as the corresponding configurations of the semiconductor device 1 according to the first embodiment, detailed description thereof will be omitted. The semiconductor device 1 according to Modification example 2 can obtain the same effect as that of the first embodiment. The semiconductor device 1 according to Modification example 2 may be combined with Modification example 1.

Modification Example 3

Figure 5:
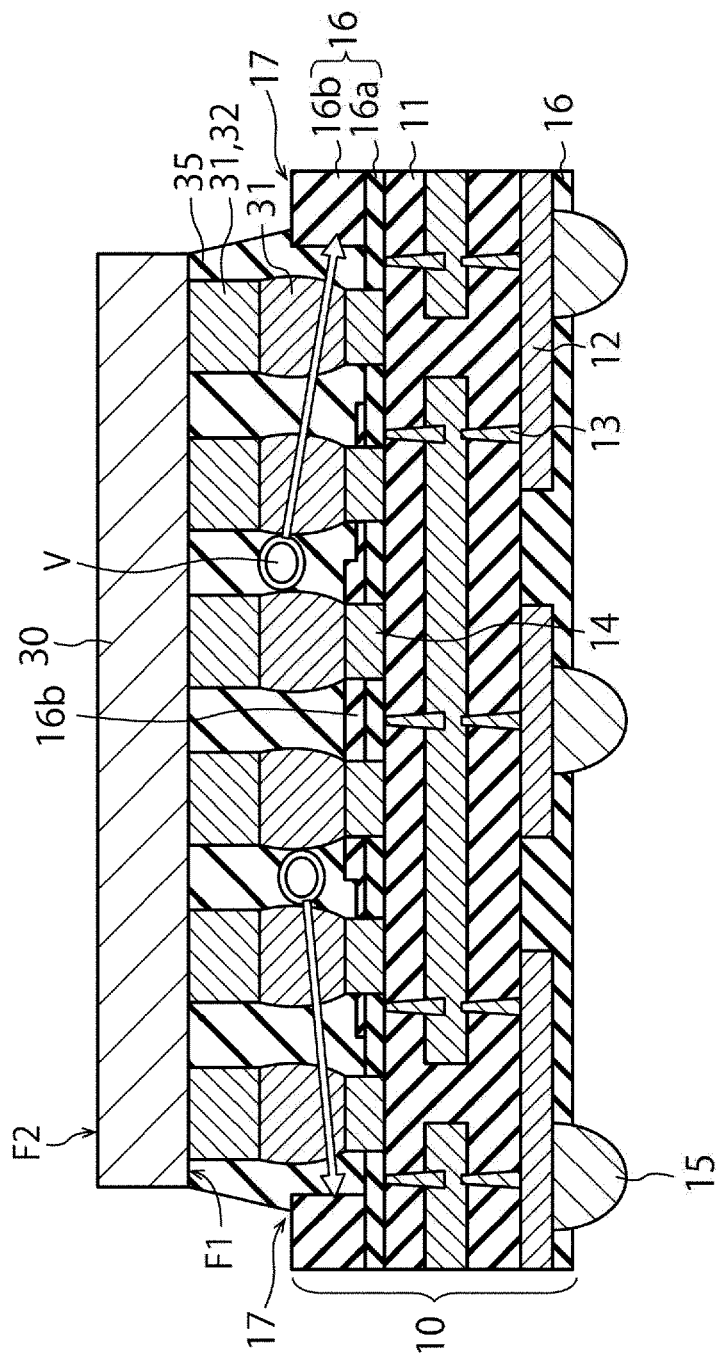
FIG. 5 is a cross-sectional view illustrating a configuration example of a wiring board, a resin layer, and surroundings thereof according to Modification example 3.

FIG. 5 is a cross-sectional view illustrating a configuration example of the wiring board 10, the resin layer 35, and surroundings thereof according to Modification example 3. Modification example 3 is different from the first embodiment in that the solder resist is applied to the wiring board 10 a plurality of times. In the example illustrated in FIG. 5, the projecting portion 17 is provided as described in Modification example 2. However, as in the first embodiment, the projecting portion 17 may not be provided.

As illustrated in FIG. 5, the solder resist 16 includes solder resists 16a and 16b. The solder resist 16a is provided at a lower part of the solder resist 16, and the solder resist 16b is provided at an upper part of the solder resist 16. Different materials are used for the solder resists 16a and 16b. For example, the material of solder resist 16a is a material having high reliability but hard to adjust the thickness by thinning processing. On the other hand, the material of solder resist 16b is a material whose thickness can be easily adjusted by thinning processing. With this configuration, insulation characteristics and easiness of thinning processing can be made compatible by using a plurality of materials. Similar to the solder resist 16, the solder resists 16a and 16b may be other insulating materials other than the solder resist.

The solder resists 16a and 16b are formed by using thinning processing. First, the solder resist 16a is provided on the insulating substrate 11 so as to fill the metal pad 14, and the solder resist 16a is thinned as a whole by thinning processing and curing processing is performed thereon. After that, the solder resist 16b may be provided on the solder resist 16a, and the solder resist 16b having a different thickness may be formed by thinning processing similar to the first embodiment.

The same material may be used for the solder resists 16a and 16b. That is, a step of the solder resist 16 may be formed not only by thinning processing but also by newly providing the solder resist 16.

Since other configurations of the semiconductor device 1 according to Modification example 3 are the same as the corresponding configurations of the semiconductor device 1 according to the first embodiment, detailed description thereof will be omitted. The semiconductor device 1 according to Modification example 3 can obtain the same effect as that of the first embodiment. The semiconductor device 1 according to Modification example 3 may be combined with Modification example 1 and Modification example 2.

Modification Example 4

Figure 6:
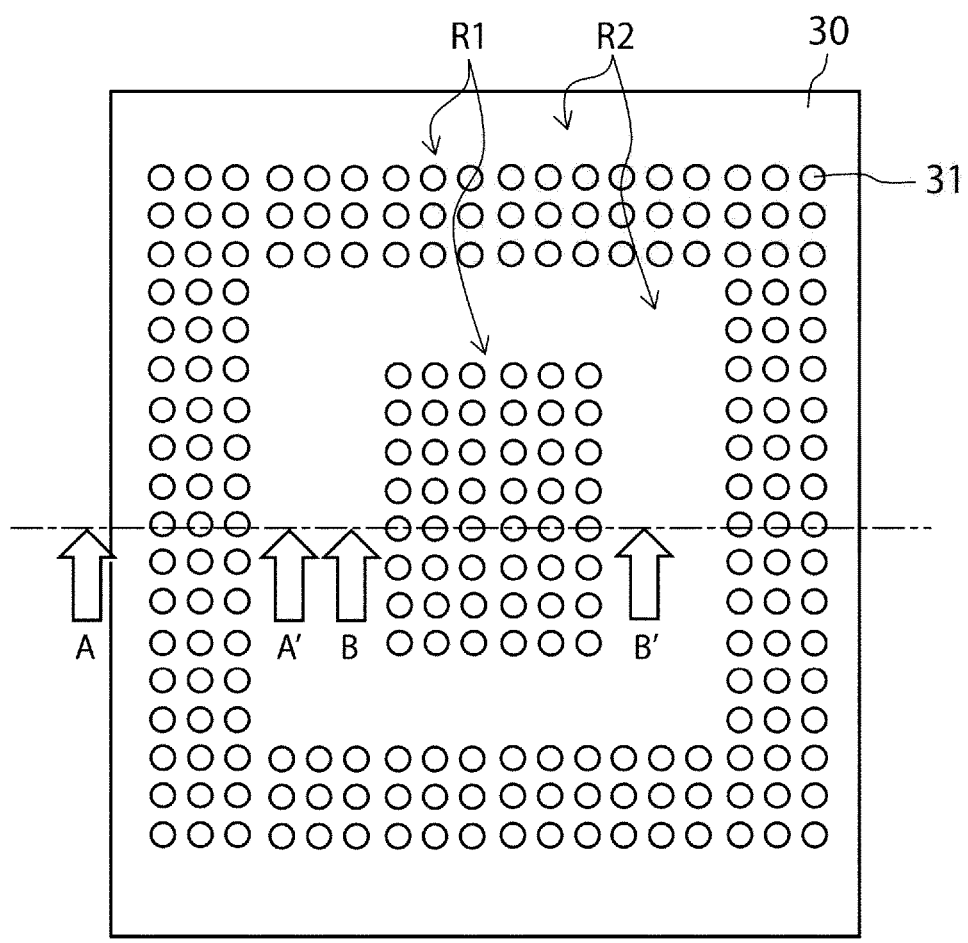
FIG. 6 is a plan view illustrating an arrangement example of metal bumps of a controller chip according to Modification example 4.

FIG. 6 is a plan view illustrating an arrangement example of the metal bumps 31 of the controller chip 30 according to the Modification example 4. Modification example 4 of the first embodiment is different from the first embodiment in that the solder resist 16 is locally thickened.

R1 indicates a region where the metal bump 31 is provided in the surface F1 of the controller chip 30. R2 indicates a region where the metal bump 31 is not provided in the surface F1 of the controller chip 30.

FIG. 7A is a cross-sectional view illustrating a configuration example of the wiring board 10, the resin layer 35, and surroundings thereof in line A-A' of FIG. 6. FIG. 7B is a cross-sectional view illustrating a configuration example of the wiring board 10, the resin layer 35, and surroundings thereof in line B-B' of FIG. 6. In the example illustrated in FIG. 7A, the projecting portion 17 is provided as described in Modification example 2. However, as in the first embodiment, the projecting portion 17 may not be provided.

The solder resist 16 facing the region R1 of the surface F1 is higher than the solder resist 16 facing the region R2 of the surface F1 other than the region R1. With this configuration, as illustrated in FIG. 7A and FIG. 7B, the resin layer 35 can be made to flow from the region R1 to the region R2. Accordingly, the void V in the region R1 can be made to move to the region R2.

As described above, the region R1 is a region where the metal bump 31 is provided. Accordingly, the void V can be moved away from the metal bump 31 and the metal pad 14. Since the void V may be a leak path, for example, electrical connection between adjacent metal pads 14 or between adjacent metal bumps 31 can be prevented.

More specifically, the solder resist 16 in the region R1 becomes thinner from the central portion to the outer peripheral portion of the region R1. With this configuration, the void V can be made easy to be discharged from the region R1. The embodiment is not limited thereto, and the thickness of the solder resist 16 in the region R1 may be changed so that the resin layer 35 flows in a desired direction.

The region R1 may be a region provided with the metal bump 31 through which an electric signal passes. In the example illustrated in FIG. 6, of the region R1 on the central side and the region R1 on the outer peripheral side, the region R1 on the central side may be used as the region R2. The metal bump 31 provided in the region R1 on the outer peripheral side includes, for example, a signal electrode. The signal electrode is used for transmitting and receiving a signal between the wiring board 10 and the controller chip 30. The signal electrode may be arranged on the outer peripheral side of the controller chip 30 in order to shorten the signal wiring. On the other hand, the metal bump 31 provided in the region R1 on the central side includes, for example, a power supply electrode and a ground electrode. The power supply electrode is connected to a power supply wiring in the wiring board 10. The ground electrode is connected to the ground wiring in the wiring board 10. For example, even if a void V serving as a leak path exists between the ground electrodes, the existence of the void V has almost no effect on the operation of the controller chip 30. However, if the void V exists between the signal electrodes, the operation of the controller chip 30 may be affected. Accordingly, only the solder resist 16 near the metal bump 31 which is the signal electrode may be thick.

Since other configurations of the semiconductor device 1 according to Modification example 4 are the same as the corresponding configurations of the semiconductor device 1 according to the first embodiment, detailed description thereof will be omitted. The semiconductor device 1 according to Modification example 4 can obtain the same effect as that of the first embodiment. The semiconductor device 1 according to Modification example 4 may be combined with Modification examples 1 to 3.

Second Embodiment

Figure 8:
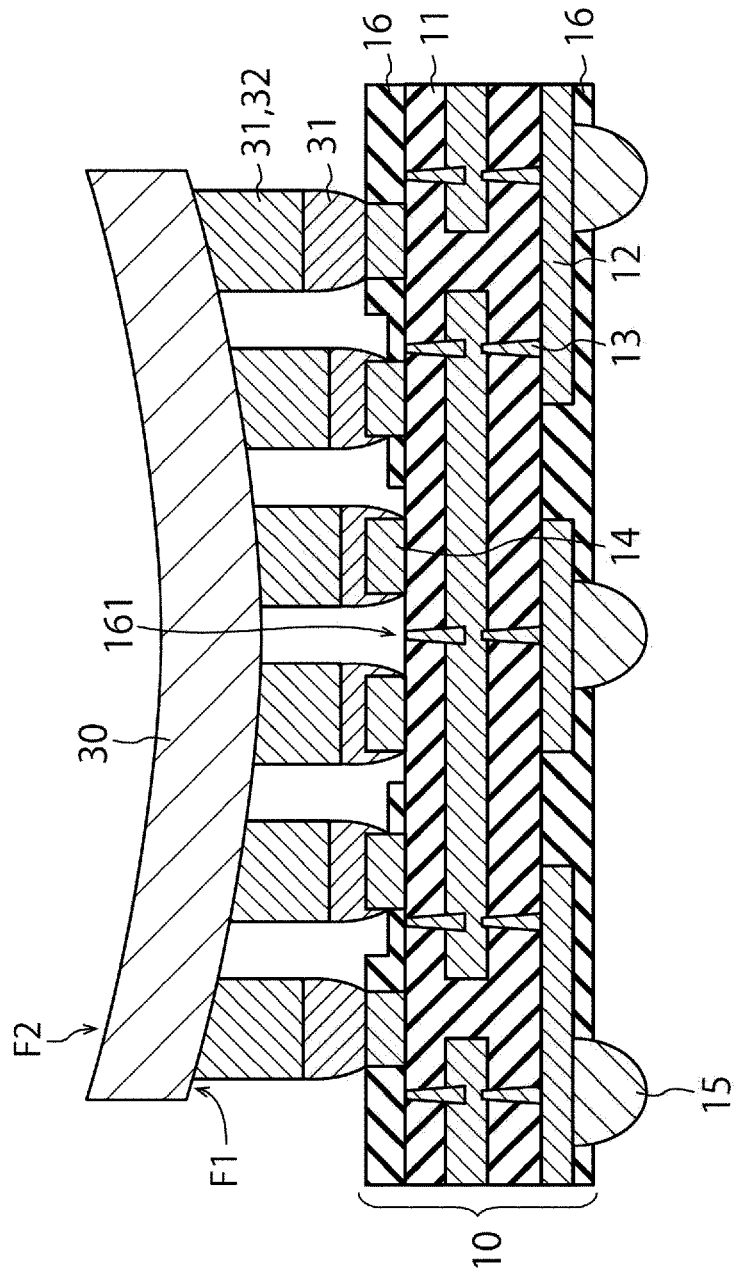
FIG. 8 is a cross-sectional view illustrating a configuration example of a wiring board and surroundings thereof according to a second embodiment.

FIG. 8 is a cross-sectional view illustrating a configuration example of the wiring board 10 and surroundings thereof according to the second embodiment. The second embodiment is different from the first embodiment in that the solder resist 16 gradually becomes thicker from the central portion to the outer peripheral portion.

FIG. 8 illustrates, for example, a cross-sectional view of the wiring board 10 and the controller chip 30 during flip-chip connection by amass reflow method. In the example illustrated in FIG. 8, the resin layer 35 (not illustrated) is supplied after the flip-chip connection. The resin layer 35 is, for example, an underfill material, enters between the wiring board 10 and the controller chip 30, and covers the periphery of the metal bump 31. Since the resin layer 35 is filled while flowing, the void V is hardly trapped in the resin layer 35. Heights of the plurality of electrode pillars 32 are substantially constant, for example. Heights of the plurality of metal pads 14 are substantially constant, for example. For example, the amount of the plurality of metal bumps 31 (solders) is substantially constant.

The controller chip 30 illustrated in FIG. 8 is warped to be projected downward. This is because the controller chip 30 is heated during flip-chip connection.

Normally, the controller chip 30 is warped to be projected upward at room temperature, and is warped to be projected downward at high temperature (for example, 240° C. or higher) during flip-chip connection. This is because the surface F2 side on which the silicon layer is provided is hard to expand, and the surface F1 side on which the device layer containing PI (Polyimide), copper, and the like is provided is easy to expand. When the controller chip 30 is warped to be projected downward, the electrode pillar 32 provided on the outer peripheral side of the controller chip 30 is separated from the metal pad 14, and thus there is a possibility that the electrode pillar 32 becomes hard to connect to the metal pad 14.

Therefore, as illustrated in FIG. 8, the solder resist 16 has a different thickness according to the location on the wiring board 10. More specifically, the solder resist 16 gradually becomes higher (thicker) from the central portion to the outer peripheral portion of the facing controller chip 30.

Below the central portion of the controller chip 30, the solder resist 16 is thin and the side surfaces of the metal pad 14 are exposed from the solder resist 16. Accordingly, in the metal bump 31, the metal pad 14 gets wet to the side surface thereof with the metal bump 31. On the other hand, below the outer peripheral portion of the controller chip 30, the solder resist 16 is thick, and the side surfaces of the metal pad 14 are covered with the solder resist 16. Accordingly, the side surfaces of the metal pad 14 do not get wet with the metal bump 31. The metal bump 31 is repelled by the solder resist 16 at a connection portion with the metal pad 14. With this configuration, the metal bump 31 becomes easy to stay in a region between the metal pad 14 and the electrode pillar 32. As a result, even if the metal pad 14 and the electrode pillar 32 are separated from each other, the connection can be further stabilized. That is, the shortage of the metal bump 31 due to the metal bump 31 getting wet on the side surface of the metal pad 14 can be prevented.

The maximum value of height of the solder resist 16 facing the controller chip 30 may be greater than the height of the metal pad 14. That is, the solder resist 16 may be thicker than the metal pad 14. With this configuration, the metal bump 31 can be pushed upward while maintaining the connection between an upper surface of the metal pad 14 and the metal bump 31. As a result, the connection between the metal pad 14 and the electrode pillar 32 can be further stabilized.

More specifically, the solder resist 16 has a height in accordance with the warpage of the controller chip 30 during the connection of the solder resist 16 with the wiring board 10. The magnitude of warpage of the controller chip 30 can be predicted in advance from, for example, the generation of the controller chip 30, the chip size thereof, the location of the metal bump 31 with respect to the controller chip 30, and the like. The difference between the maximum value and the minimum value of the thickness of the solder resist 16 may be greater than the warpage of the controller chip 30. In this case, the thickness of the solder resist 16 may be set to vary within a range between the maximum value and the minimum value thereof.

In the example illustrated in FIG. 8, the solder resist 16 has the opening 161. With this configuration, the minimum value of the thickness of the solder resist 16 can be further reduced (substantially zero). As a result, the solder resist 16 can be made easy to be formed at a height in accordance with the warpage of the controller chip 30.

Since other configurations of the semiconductor device 1 according to the second embodiment are the same as the corresponding configurations of the semiconductor device 1 according to the first embodiment, detailed description thereof will be omitted.

Modification Example 5

Figure 9:
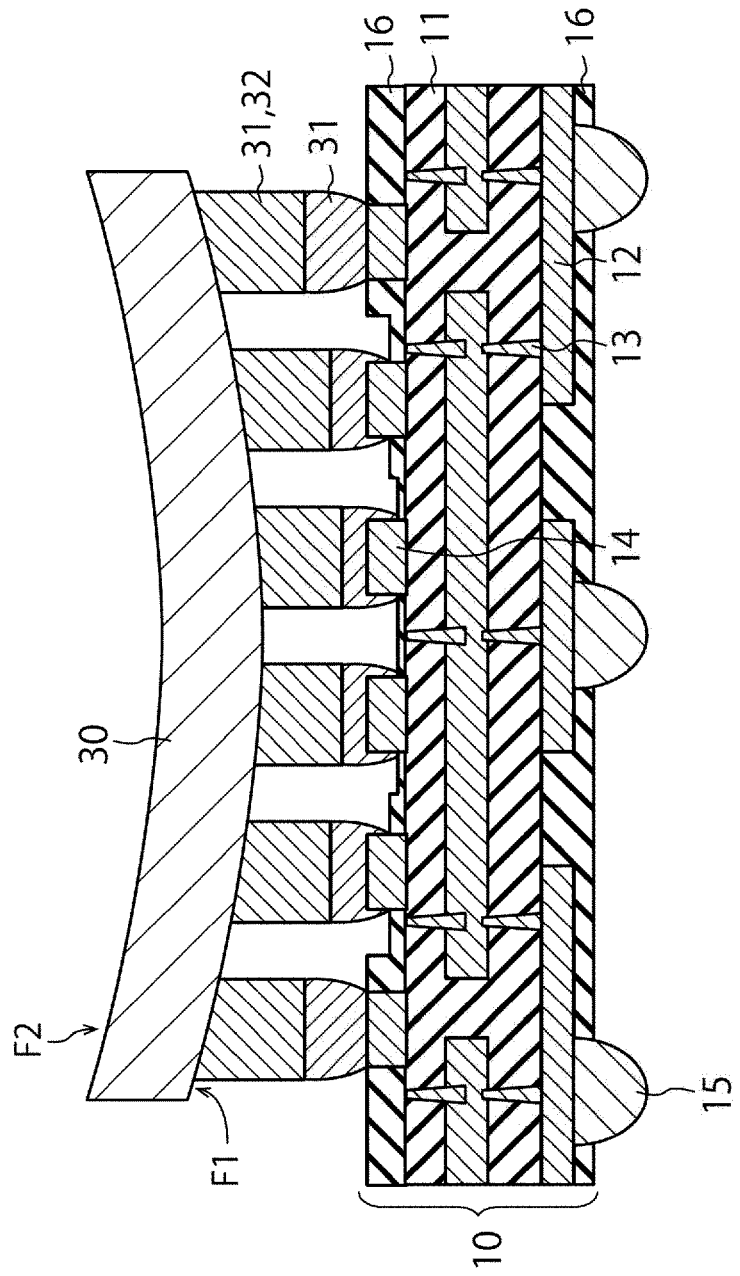
FIG. 9 is a cross-sectional view illustrating a configuration example of a wiring board and surroundings thereof according to Modification example 5.

FIG. 9 is a cross-sectional view illustrating a configuration example of the wiring board 10 and surroundings thereof according to Modification example 5. Modification example 5 of the second embodiment is different from the second embodiment in that the opening 161 is not provided.

That is, the solder resist 16 does not have the opening 161 that exposes the insulating substrate 11 from the solder resist 16. In this case, as described in the first embodiment, the HAST resistance can be improved.

Since other configurations of the semiconductor device 1 according to Modification example 5 are the same as the corresponding configurations of the semiconductor device 1 according to the second embodiment, detailed description thereof will be omitted. The semiconductor device 1 according to Modification example 5 can obtain the same effect as that of the second embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   an insulating substrate;
   a wiring provided on the insulating substrate;
   a wiring board including (i) an insulating material and (ii) a pad exposed relative to the insulating material and electrically connected to the wiring, a height of the insulating material in a vertical direction of the wiring board varying along the wiring board;
   a semiconductor chip including a bump connected to the pad on a first surface of the semiconductor chip; and
   a resin layer covering a periphery of the bump between the wiring board and the semiconductor chip, wherein
   the height of the insulating material decreases from a first region which is located near a central portion of the semiconductor chip toward a second region which is located further out than the first region, increases from the second region toward a third region which is located further out than the second region, and decreases from the third region toward a fourth region which is located further out than the third region, and
   the wiring board further includes a projecting portion that projects from the insulating material toward an outer peripheral portion of the semiconductor chip, the projection portion being lower than the semiconductor chip.

2. The semiconductor device according to claim 1, wherein the bump is provided in the first region.

3. The semiconductor device according to claim 2, wherein an electrical signal passes through the bump.

4. The semiconductor device according to claim 1, wherein
   a height of an upper surface of the wiring board in the vertical direction of the wiring board is equal to or greater than a height of the pad in the vertical direction of the wiring board.

5. The semiconductor device according to claim 1, wherein a maximum value of a height of the insulating material facing the semiconductor chip is equal to or less than a height of the pad.

6. The semiconductor device according to claim 1, wherein the height of the insulating material is higher in a central portion of the semiconductor chip facing the wiring board than an outer peripheral portion of the semiconductor chip facing the wiring board.

7. The semiconductor device according to claim 6, wherein the insulating material has a height based on warpage of the semiconductor chip during connection with the wiring board.

8. The semiconductor device according to claim 6, wherein a maximum value of the height of the insulating material facing the semiconductor chip is greater than a height of the pad.

9. The semiconductor device according to claim 1,
wherein the insulating material is continuous to prevent exposing the insulating substrate from the insulating material.

10. The semiconductor device according to claim 1,
wherein the insulating material is a solder resist.

11. The semiconductor device according to claim 1,
wherein the insulating material covers the insulating substrate to prevent exposing the insulating substrate from the insulating material.

12. The semiconductor device according to claim 1,
wherein the insulating material covers the insulating substrate to prevent moisture from entering the resin layer.

13. The semiconductor device according to claim 1,
wherein the insulating material is continuous to prevent exposing the insulating substrate material.

14. The semiconductor device according to claim 1,
wherein the insulating material has an opening that exposes the insulating substrate from the insulating material.

15. The semiconductor device according to claim 1,
wherein the insulating material includes a first insulating material and a second insulating material different from the first insulating material.

16. The semiconductor device according to claim 15, wherein
the first insulating material is provided at a lower part of the insulating material in the vertical direction of the wiring board,
the second insulating material is provided at an upper part of the insulating material in the vertical direction of the wiring board.

17. The semiconductor device according to claim 15, wherein the first insulating material is a material relatively harder to adjust a thickness thereof by thinning processing, and the second insulating material is a material relatively easier to adjust a thickness by thinning processing.

18. The semiconductor device according to claim 1,
wherein the bump is provided in the third region.

19. The semiconductor device according to claim 1,
when viewed from a plan view, the projection portion overlaps the semiconductor chip.

* * * * *